United States Patent

Iwata et al.

[11] Patent Number: 5,887,007
[45] Date of Patent: Mar. 23, 1999

[54] VITERBI DECODING METHOD AND VITERBI DECODING CIRCUIT

[75] Inventors: Jun Iwata; Masami Abe, both of Tokyo, Japan

[73] Assignee: OKI Electric Industry Co., Ltd., Tokyo, Japan

[21] Appl. No.: 799,826

[22] Filed: Feb. 13, 1997

[30] Foreign Application Priority Data

Feb. 23, 1996 [JP] Japan ................................. 8-036294

[51] Int. Cl.⁶ ........................... G06F 11/10; H03M 13/12
[52] U.S. Cl. ...................... 371/43.7; 371/43.6; 371/43.1; 371/48
[58] Field of Search .................. 371/43.7, 43.6, 371/48, 43.1, 30; 375/341, 349; 395/185.03

[56] References Cited

U.S. PATENT DOCUMENTS 5,349,589  9/1994  Chennakeshu et al. .................. 371/43

FOREIGN PATENT DOCUMENTS

08008762 A  1/1996  Japan .

*Primary Examiner*—Phung M. Chung
*Attorney, Agent, or Firm*—Venable; Robert J. Frank; Allen Wood

[57] ABSTRACT

A convolutional code having identical initial and final states is decoded by using the Viterbi algorithm to trace a path starting from a first state and ending at a second state. If necessary, the trace is repeated, starting from the second state, provided the second state is not the same as the first state. The output result is then obtained from the second trace.

10 Claims, 7 Drawing Sheets

VITERBI DECODING METHOD AND VITERBI DECODING CIRCUIT

BACKGROUND OF THE INVENTION

The present invention relates to a Viterbi decoding method and Viterbi decoding circuit suitable for decoding a convolutional code in which the initial and final states of the coder are unknown, but are identical.

A convolutional code of this type is employed in, for example, the fast associated control channel (FACCH) of the North American time-division multiple-access (TDMA) digital cellular telephone system. The convolutional coder has a finite number of states, among which transitions occur in response to the data to be coded. The Viterbi decoding algorithm is a well-known maximum-likelihood algorithm that constructs hypothetical paths among these states in the coder, keeping track of one most likely path terminating on each state. When the paths reach a certain length, the most likely path of all is selected and retraced to obtain the decoded data.

If the decoded data turn out to be incorrect, one possible cause is that the decoder selected the path terminating on the wrong state. One possible solution is accordingly to select different states and trace a path from each one in turn, until correct data are obtained. The paths should be traced in decreasing order of likelihood. Unfortunately, many paths tend to have similar likelihood values, and there is no guarantee that the correct path will have one of the highest likelihood values. It will often be necessary to test a large number of paths before finding the correct one, so this solution can be quite time-consuming Another possible solution is to provide extra hardware, so that the paths from different states can all be traced in parallel. The necessary amount of hardware is not small, however. The FACCH coder, for example, has thirty-two states, so performing all traces in parallel would multiply the hardware requirements by a factor of thirty-two.

A further problem is that it is difficult to tell whether a decoding error is due to selection of the wrong path, or some other reason. In the latter case, correct data will not be obtained from any trace, and the repeated traces will all be in vain.

This problem would not occur if the initial and final states were fixed, but the restriction to fixed initial and final states would reduce the amount of information that could be coded. Conversely, unfixed initial and final states permit more information to be coded within a given number of bits, but the decoding error rate is increased, because the decoder does not know the initial and final states in advance.

SUMMARY OF THE INVENTION

An object of the present invention is to reduce the error rate in convolutional decoding without performing a large number of repeated traces.

The invented method of decoding a convolutional code having identical initial and final states stores path information representing state transitions, selects a first state, and traces a first path starting from the first state according to the path information, thereby obtaining first decoded information. The terminating state of the first path is stored as a second state. Under certain conditions, such as an error in the first decoded information, the first state is compared with the second state, and if the first state differs from the second state, a second path is traced from the second state, using the same path information, to obtain second decoded information. The decoded result is then output responsive to the second decoded information.

DETAILED DESCRIPTION OF THE INVENTION

An embodiment of the invention will be described with reference to the attached illustrative drawings, following a general explanation of how a convolutional code is generated and decoded.

Figure 1:
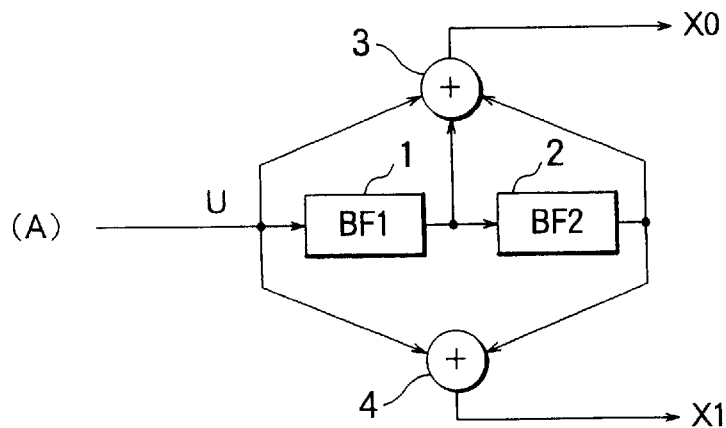
FIG. 1 is a block diagram of a convolutional coder.

FIG. 1 shows a simple example of a convolutional coder comprising a pair of one-bit buffers 1 and 2 and a pair of exclusive-OR gates 3 and 4. The buffers, designated BF1 and BF2, are coupled in series. An input bit U is stored first in buffer 1 (BF1), then in buffer 2 (BF2). Exclusive-OR gate 3 takes the exclusive logical OR of the input and output of buffer 1 and the output of buffer 2, thus obtaining the exclusive logical OR of three consecutive input bits. Exclusive-OR gate 4 takes the exclusive logical OR of the first and last of these three bits. (The exclusive logical OR of any number of bits is the sum of the bits, modulo two.) The output of the decoder consists of the two bits X0 and X1 output from exclusive-OR gates 3 and 4.

Figure 2:
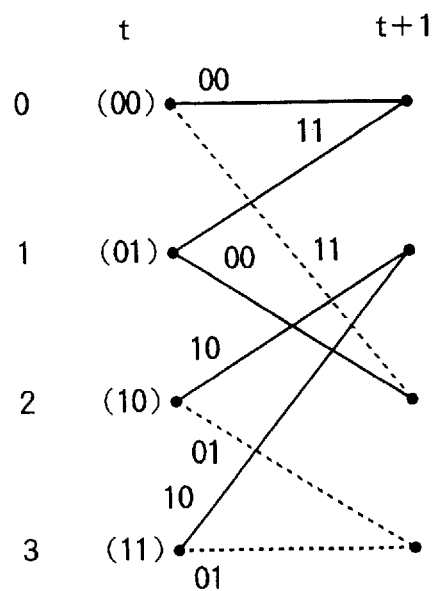
FIG. 2 is a trellis diagram illustrating the operation of the coder in FIG. 1.

FIG. 2 illustrates the operation of this coder in the form of a trellis diagram. The current state of the coder is defined by the contents of the buffers 1 and 2. At a given time t there are four possible states, as indicated on the left in the drawing: state zero (00), state one (01), state two (10), and state three (11). In each state, input of a bit with a value of 'zero' (0) causes output of the two bits shown adjacent the solid line leading from that state, followed by a transition to a new state at time t+1 as indicated by the solid line. Input of a bit with a value of 'one' (1) causes output of the two bits shown adjacent the dotted line, followed by a transition to a new state at time t+1 as indicated by the dotted line.

The convolutional code generated by this coder is said to have a code rate (r) of one-half and a constraint length (k) of three, and to be generated by the polynomials $x^2+x+1$ and $x^2+1$. The output bits are produced by convolving the input bit stream with these two polynomials, modulo two. For a general convolutional code of constraint length k, the coder has k−1 one-bit buffers, and the number of possible states is $2^{k-1}$.

Figure 3:
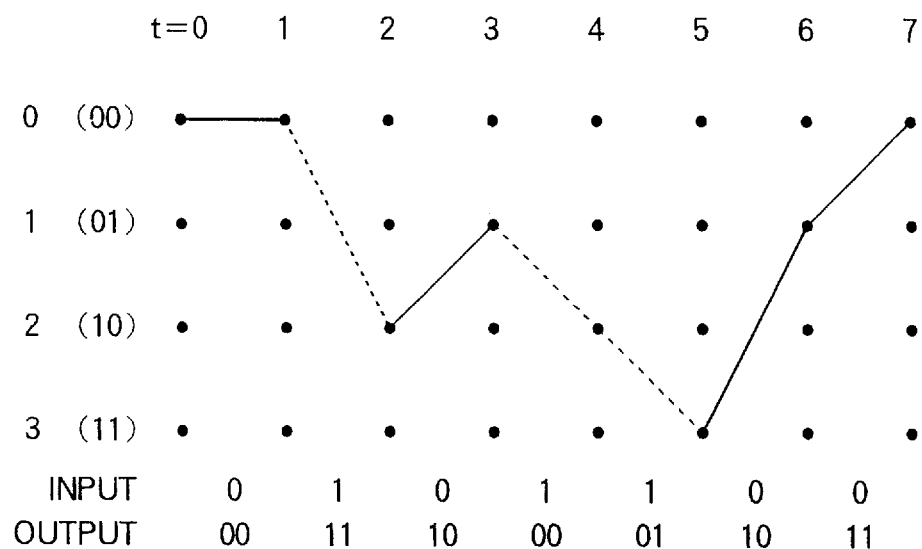
FIG. 3 is a longer trellis diagram, showing a specific example of the operation of the coder in FIG. 1.

FIG. 3 shows an example of the state transitions and output bits when the coder in FIG. 1 is initially in state zero

(00) and receives the input bit sequence '0101100.' Solid and dotted lines are used to indicate the state transitions caused by input of 'zero' and 'one' bits, respectively. The output sequence '00 11 10 00 01 10 11' can be decoded by tracing the path of state transitions and deducing the input bit that caused each transition.

Figure 4:
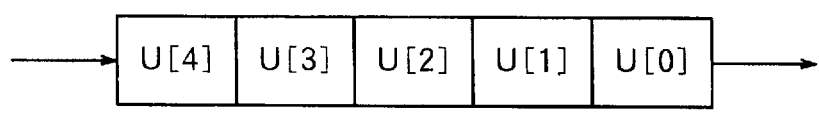
FIG. 4 illustrates the initial and final states of a FACCH coder.

The convolutional code used in the fast associated control channel of the North American TDMA cellular telephone system has a constraint length of six, so the coder has five one-bit buffers. To encode a block consisting of n bits of input data U[0], . . . , U[n−1], the coder begins by loading the first five bits U[0], . . . , U[4], as indicated in FIG. 4, to create an initial state. Next, bits U[5] to U[n−1] are input one by one, each input bit generating one set of output bits. Finally, bits U[0] to U[4] are input to the coder again, producing five more sets of output bits. The final state of the coder is thus the same as the initial state, with bits U[0] to U[4] stored in the five one-bit buffers as shown in FIG. 4.

If the coder in FIGS. 1 to 3 were to operate in a similar manner, the output bits shown in FIG. 3 would be obtained from the input bit sequence '0001011,' the first two bits (00) being loaded as the initial state, then input again at the end of the sequence.

The conventional Viterbi decoding algorithm can be described briefly as follows.

Figure 5:
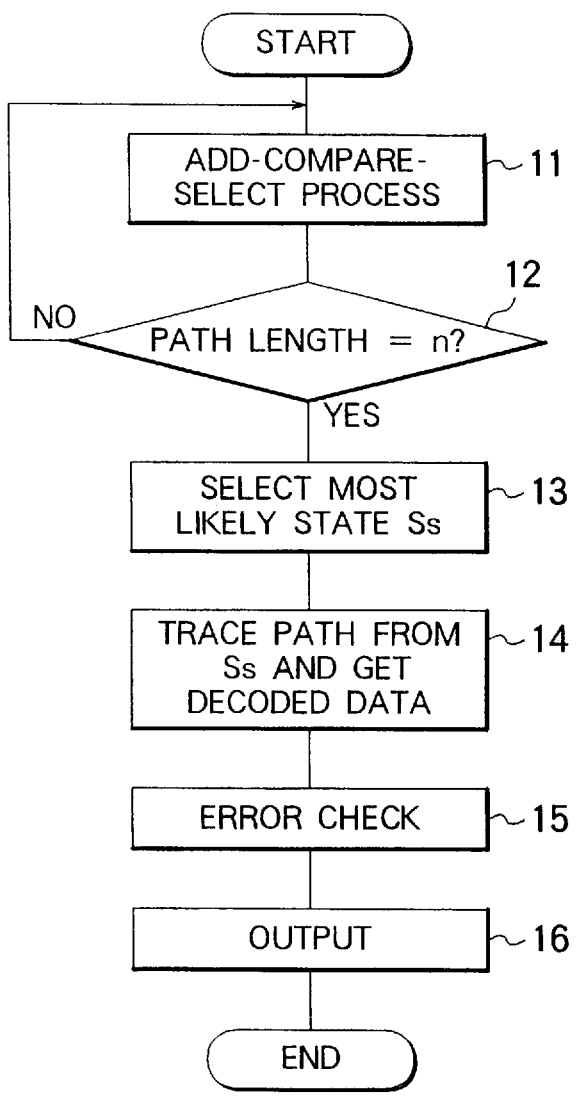
FIG. 5 is a flowchart illustrating the conventional Viterbi decoding method.

Referring to FIG. 5, each time the decoder receives the transmitted signal that was produced from one bit of input to the coder, an add-compare-select (ACS) process is carried out (step 11). This process, which will be described in more detail later, selects one path terminating on each state. The ACS process is repeated as further signals are received, until the paths have reached a certain length n (step 12). Next, path metric values associated with the paths are compared, and the state on which the most likely path terminates is selected (step 13). This state (Ss) is referred to as the most likely state. Decoded data are then obtained by tracing a path back from this state (step 14). The decoded data are checked for errors (step 15), and a decoded result is output (step 16).

The present invention follows the general procedure shown in FIG. 5, with the addition of novel steps that will be described below.

Figure 6:
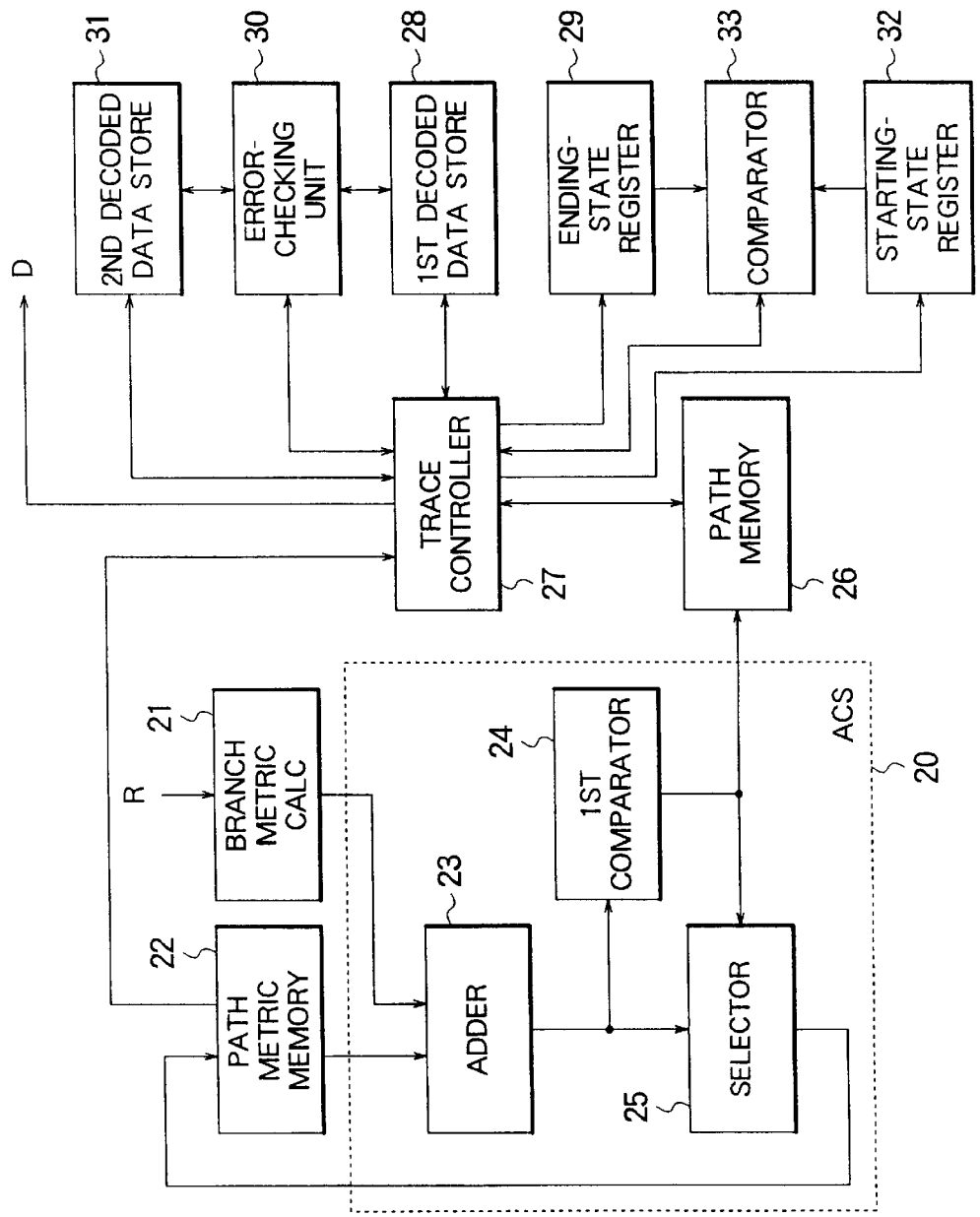
FIG. 6 is a block diagram of the invented Viterbi decoding circuit.

FIG. 6 shows the hardware configuration of an embodiment of the present invention. The ACS process is carried out by an ACS unit 20, a branch metric calculation unit 21, and a path metric memory 22. The ACS unit 20 comprises an adder 23, a first comparator 24, and a selector 25. The resulting path information is stored in a path memory 26. When a certain amount of path information has been stored, the information is decoded and checked by a trace controller 27, a first decoded data store 28, an ending-state register 29, an error-checking unit 30, a second decoded data store 31, a starting-state register 32, and a second comparator 33. The path metric memory 22, path memory 26, first decoded data store 28, ending-state register 29, and second decoded data store 31 comprise well-known memory facilities such as random-access memory (RAM) or shift registers. The other elements comprise well-known computing facilities, detailed descriptions of which will be omitted.

The path metric memory 22 stores one path metric value for each possible state of the convolutional coder, representing the maximum likelihood of a path terminating on that state. For the coder in FIG. 1, the path metric memory 22 would store four path metric values.

The branch metric calculation unit 21 compares the received signal R corresponding to one input bit in the coder with the signals that should be received for all possible state transitions in the coder, and calculates a branch metric for each state transition, indicating how closely the received signal R represents that transition. For the coder in FIG. 1, each time two bits (X0 and X1) are received, the branch metric calculation unit 21 calculates eight branch metrics, corresponding to the eight state transitions shown in FIG. 2.

The adder 23 adds the branch metric values calculated by the branch metric calculation unit 21 to the path metric values stored in the path metric memory 22, producing two new candidate path metric values for each state. As an example, assume that at time six (t=6) in FIG. 7, the most likely path terminating on state one (01) is the path from time zero (t=0) to time six (t=6) indicated by the solid and dotted lines. From state one (01) at time six there are two possible transitions: to state zero (00) at time seven (t=7), and to state two (10) at time seven. The adder 23 adds the branch metrics of each of these transitions to the metric value currently stored for state one in the path metric memory 22, thus obtaining the metric values of one new candidate path terminating on state zero, and another candidate path terminating on state two.

For each state, the comparator 24 compares the metric values of the candidate paths terminating on that state, as calculated by the adder 23. The selector 25 selects the most likely path, and stores path information representing the most recent state transition of that path in the path memory 26. If the most likely path terminating on state zero (00) at time seven (t=7) is the path from state one (01) at time six (t=6), for example, information indicating a transition from state one is stored in the path memory 26 for state zero at time seven. The path memory 26 stores one such item of information for each state at each time. The selector 25 also updates the path metric memory 22 to reflect the metric values of the selected paths.

When activated, the trace controller 27 compares the metric values stored in the path metric memory 22 to find the state on which the most likely path of all terminates. This state (the most likely state), is stored in the starting-state register 32. The trace controller 27 then accesses the path memory 26 and traces a path back from this most likely state to the initial time (t=0). Each state transition on the path yields one decoded bit, which the trace controller 27 stores in the first decoded data store 28. At the end of the trace, the first decoded data store 28 contains one complete set of decoded data. The state reached at the end of the trace (the initial state of the coder) is stored in the ending-state register 29.

Depending on information received from the error-checking unit 30 and second comparator 33, the trace controller 27 may also execute a second trace, starting from the state stored in the ending-state register 29 instead of the state in the starting-state register 32. The decoded data obtained from this second trace are stored in the second decoded data store 31.

The trace controller 27 also outputs a decoded result D responsive to the contents of the first decoded data store 28 and second decoded data store 31 and information received from the error-checking unit 30.

The error-checking unit 30 executes error checks on the decoded data stored in the first decoded data store 28 and second decoded data store 31, and furnishes the results to the trace controller 27.

The second comparator 33 compares the contents of the starting-state register 32 and ending-state register 29, and informs the trace controller 27 as to whether or not the two registers 29 and 32 contain the same state.

The operation of the decoding circuit in FIG. 7 will next be described for the case of the fast associated control channel (FACCH) in the North American TDMA cellular telephone system. The FACCH data include cyclic redundancy check bits that enable the error-checking unit 30 to detect errors in the decoded data.

Figure 8:
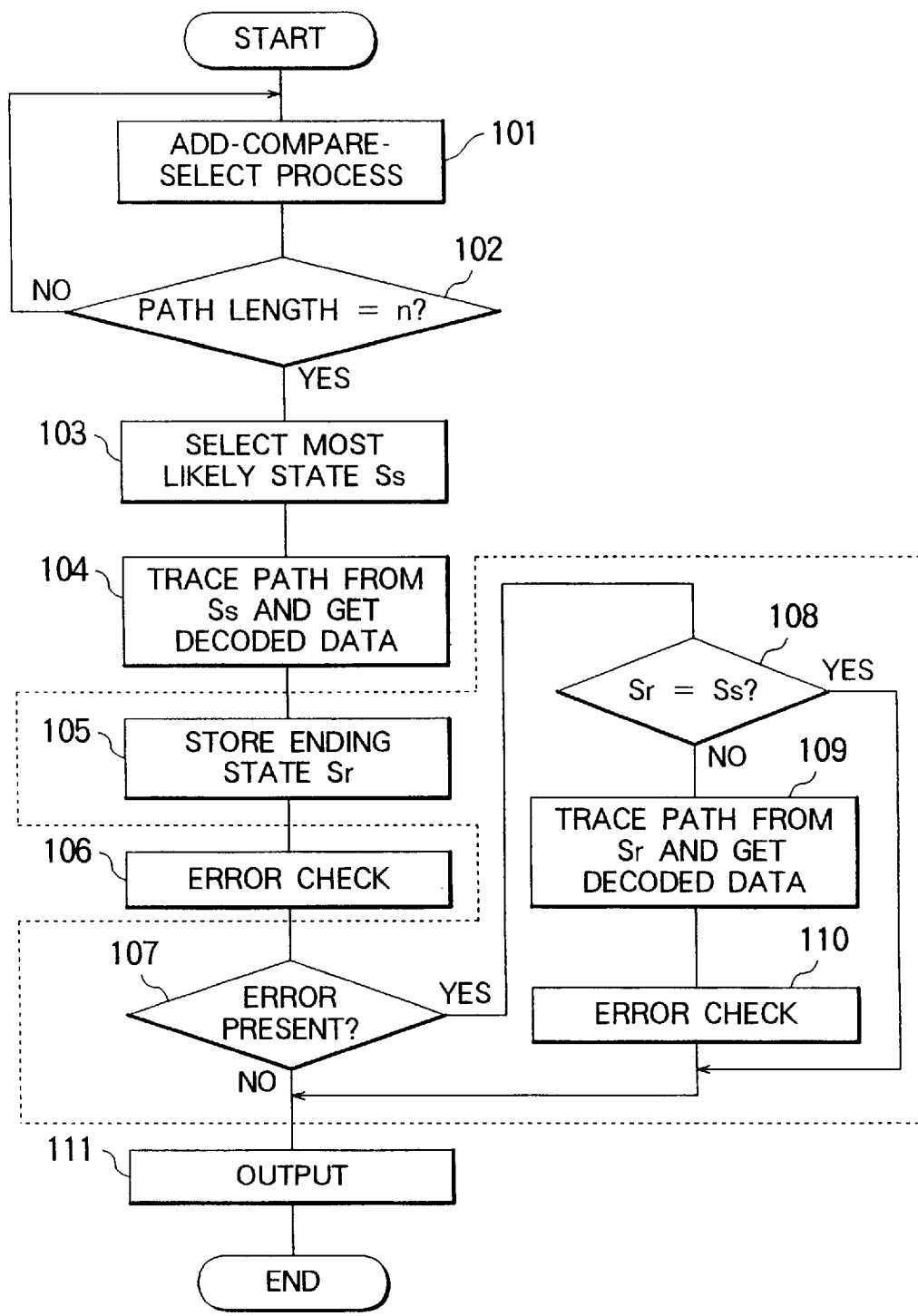
FIG. 8 is a flowchart describing the operation of the circuit in FIG. 6.

Referring to FIG. 8, the add-compare-select process described above is carried out n times (steps 101 and 102). The number n is the block length of the FACCH data. At the end of this process, the path memory 26 contains path information describing thirty-two paths, each of length n, one path terminating on each state of the FACCH coder.

Next, the trace controller 27 is activated and selects the most likely state (Ss) according to the path metric values stored in the path metric memory 22 (step 103). The most likely state Ss is stored in the starting-state register 32. Using the information in the path memory 26, the trace controller 27 traces the path starting from this state Ss backward, and stores the resulting decoded data in the first decoded data store 28 (step 104). The state Sr reached at the end of the trace (the initial state of the coder) is stored in the ending-state register 29 (step 105).

The error-checking unit 30 then carries out a cyclic redundancy check on the data stored in the first decoded data store 28 and notifies the trace controller 27 of the result (step 106). The trace controller 27 tests this result to decide how to proceed (step 107). If an error is present, the trace controller 27 commands the second comparator 33 to compare the most likely state Ss in the starting-state register 32 with the state Sr stored in the ending-state register 29 (step 108). If state Ss differs from state Sr, the trace controller 27 executes a second trace, starting from state Sr, and stores the resulting decoded data in the second decoded data store 31 (step 109). The error-checking unit 30 then carries out a cyclic redundancy check on the data in the second decoded data store 31 (step 110).

Following the processing above, the trace controller 27 outputs a decoded result as follows (step 111). If the error-checking unit 30 found no errors in the data in the first decoded data store 28, these decoded data are output as the decoded result. If there was an error in the data in the first decoded data store 28 but the states stored in the starting-state and ending-state registers 32 and 29 were the same (Ss=Sr), the second trace is skipped, and the trace controller 27 outputs predetermined information indicating that the received signal could not be decoded correctly. If there was an error in the data in the first decoded data store 28 and the states stored in the starting-state and ending-state registers 32 and 29 were not the same (Ss≠Sr), but the data stored in the second decoded data store 31 as a result of the second trace contain an error, the trace controller 27 outputs similar predetermined information indicating that the received signal could not be decoded correctly. If the there is no error in the data stored in the second decoded data store 31 as a result of the second trace, the trace controller 27 outputs the contents of the second decoded data store 31 as the decoded result.

To take a specific example, suppose that n=7, and that the data U[0], . . . , U[6] are '0001011,' so that the coder starts from initial state zero (00) and receives '0101100' as input data, as in FIG. 3. Suppose also that the most likely state (Ss) selected by the trace controller 27 in step 103 is state two (10). Referring to FIG. 7, the first trace performed by the trace controller 27 starts at state two at time seven (t=7) and proceeds back through state one (01) at time six (t=6) to state zero (00) at time zero (t=0). The state (Sr) stored in the ending-state register 29 is accordingly state zero (00).

Figure 7:
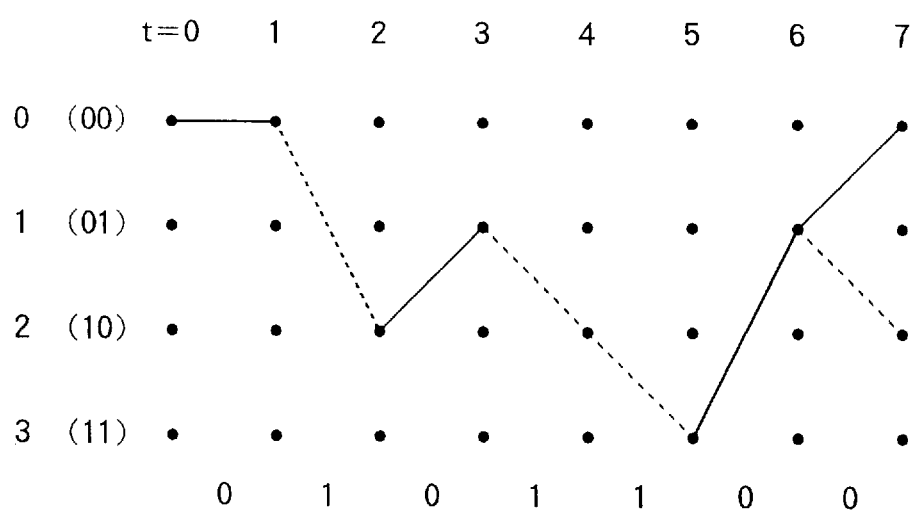
FIG. 7 is a trellis diagram illustrating the operation of the circuit in FIG. 6.

The decoded data obtained from this trace are '0101101' as indicated at the bottom of FIG. 7. Inclusion of the initial state (00) gives '000101101.' The last bit is incorrect, so the error-checking unit 30 reports an error. Since this trace started from state two and ended at state zero, the decision in step 108 is that Sr≠Ss, and a second trace is performed, starting from state zero (00) at time seven (t=7). This time the correct data '000101100' are obtained, so the error-checking unit 30 reports no error. Since the last two bits are simply a repetition of the first two bits, the trace controller 27 deletes these last two bits and outputs '0001011' as the decoded result.

Even when a trace starts from the wrong state, there is a strong probability that it will end at the right state, as in the example in FIG. 7. When the initial and final states of the convolutional code are known to be the same, the state at which a trace ends is therefore very likely to be the state from which the trace should have started. The second trace performed in the present invention accordingly has a good chance of correcting errors in the first trace.

Conversely, if errors occur in the second trace, the chances of obtaining correct data by further traces are not particularly good; it is entirely likely that no trace will yield correct data. By performing a second trace and no further traces, the present invention can therefore substantially improve the probability of obtaining correct data, without causing excessive time to be wasted on traces that do not yield correct results.

Figure 9:
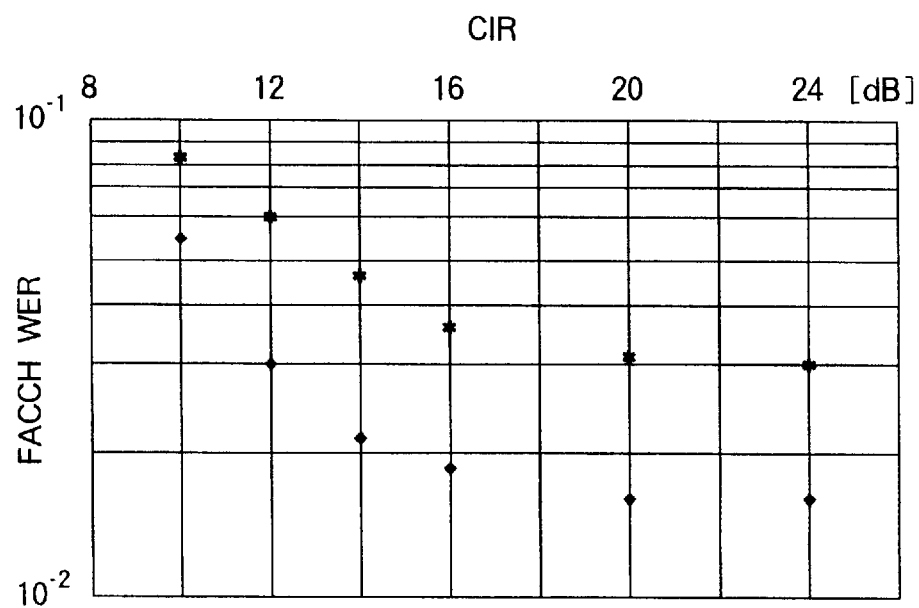
FIG. 9 is a graph of simulated error rates achieved by the invented decoding circuit and a conventional decoding circuit.

FIG. 9 shows the results of a simulation of the performance of the conventional Viterbi decoding method and the invented method in decoding FACCH data under various co-channel interference conditions. The co-channel interference ratio (CIR) is shown in decibels (dB) on the horizontal axis. The FACCH word error rate (WER) is shown on the vertical axis. Results obtained with the conventional Viterbi decoding method are indicated by X's, while results obtained with the invented method are indicated by solid black marks. For a given word error rate, the invented method can be seen to tolerate about four to ten more decibels of interference than the conventional method.

As a modification of the above embodiment, the final bits of decoded data, which are known to be equal to the initial state of the coder, can be omitted from the error check. In the example in FIG. 7, the error check could be confined to the first seven bits of decoded data '0001011,' including the initial state reached at the end of the first trace but omitting the final two bits. This modification improves the probability of obtaining a correct result in a single trace.

The invention is particularly effective with convolutional codes having a long constraint length, hence a large number of states. When there are many states, it becomes difficult to select the most likely state correctly, so there is a significant chance that the first trace will start from the wrong state, producing errors that the present invention can correct on the second trace.

The invention is not limited to the decoding of FACCH data in the North American TDMA cellular system, but can be applied in receiver equipment for any digital communication system in which a convolutional code with identical initial and final states is employed, including code-division multiple-access systems and satellite systems, for example.

If the second trace produces incorrect decoded data, and if the second trace starts and ends at different states, it is possible to perform a third trace, starting from the ending state reached in the second state, provided this state is also different from the most likely state from which the first trace started. This procedure can be continued as long as new ending states, different from the most likely state, are obtained. It is generally preferable, however, that the number of traces be limited to two, as further traces encounter diminishing returns.

It is not necessary for the traces to be performed backward from the final state to the initial state as in the embodiment described above. The decoding circuit can be configured to trace forward from the initial state to the final state, in which case the path metric memory 22 stores one path metric value for each possible initial state, and the trace controller 27 selects the most likely initial state. If the decoded data obtained from the first trace are incorrect, a second trace is performed, using the final state reached in the first trace as a new initial state.

The elements shown in FIG. 6 need not all be separate. The ACS unit 20, trace controller 27, error-checking unit 30, and second comparator 33, for example, can be combined into a single computational unit, which may be either a specially designed circuit such as a gate-array logic circuit, or a general-purpose computing device, such as a microprocessor or digital signal processor, executing a suitable program.

Those skilled in the art will recognize that further modifications are possible within the scope claimed below.

What is claimed is:

1. An improved method of decoding a convolutional code having identical initial and final states, the method being of the type that stores path information representing state transitions, selects a first state, traces a first path starting from said first state according to said path information, and obtains first decoded information from said first path, the improvement comprising the steps of:

storing a terminating state of said first path as a second state;

comparing said first state with said second state;

tracing a second path according to said path information, starting from said second state, if said second state differs from said first state;

obtaining second decoded information from said second path; and outputting a decoded result responsive to said second decoded information.

2. The method of claim 1, wherein said first path is a most likely path.

3. The method of claim 1, comprising the further step of checking for errors in said first decoded information, wherein the step of tracing a second path is performed only when there is an error in said first decoded information.

4. The method of claim 3, comprising the further steps of:

outputting said first decoded information as said decoded result, when there are no errors in said first decoded information;

checking for errors in said second decoded information; and outputting said second decoded information as said decoded information, when there are no errors in said second decoded information.

5. The method of claim 4, comprising the further steps of:

outputting predetermined information as said decoded result, when there is an error in said first decoded information and said first state is identical to said second state; and outputting said predetermined information as said decoded result, when there is an error in said second decoded information.

6. A decoding circuit for decoding a convolutional code with identical initial and final states, having a path memory for storing path information representing state transitions, a path metric memory for storing metric values, a computational unit for computing said metric values and said path information, and a trace controller for selecting a first state, tracing a first path starting from said first state according to said path information, and obtaining first decoded information from said first path, also comprising:

an ending-state storage unit for storing, as a second state, a state at which said first path ends;

an error-checking unit for checking for errors in said first decoded information; and a comparator for comparing said first state with said second state; wherein when said error-checking unit finds an error in said first decoded information and said comparator finds that said first state differs from said second state, said trace controller traces a second path according to said path information, starting from said second state, obtains second decoded information from said second path, and outputs a decoded result responsive to said second decoded information.

7. The decoding circuit of claim 6, wherein said trace controller selects said first state according to the metric values stored in said path metric memory, by selecting as said first state a state indicated by said metric values to be a terminating state of a maximum-likelihood path.

8. The decoding circuit of claim 6, wherein said error-checking unit also checks for errors in said second decoded information.

9. The decoding circuit of claim 8, wherein said trace controller outputs said first decoded information as said decoded result when there are no errors in said first decoded information, and outputs said second decoded information as said decoded information when there are no errors in said second decoded information.

10. The decoding circuit of claim 9, wherein said trace controller outputs predetermined information as said decoded result when there is an error in said first decoded information but said first state is equal to said second state, and outputs similar predetermined information when there is an error in said second decoded information.

* * * * *